(12) United States Patent
Moon et al.

(10) Patent No.: US 10,528,496 B2
(45) Date of Patent: Jan. 7, 2020

(54) CONTROLLER AND OPERATING METHOD THEREOF

(71) Applicants: SK hynix Inc., Gyeonggi-do (KR); Korea Advanced Institute of Science and Technology, Daejeon (KR)

(72) Inventors: Jaekyun Moon, Daejeon (KR); Soon-Young Kang, Daejeon (KR); Sung-Whan Yoon, Daejeon (KR)

(73) Assignees: SK hynix Inc., Gyeonggi-do (KR); Korea Advanced Institute of Science and Technology, Daejeon (KR)

( * ) Notice: Subject to any disclaimer, the term of this patent is extended or adjusted under 35 U.S.C. 154(b) by 402 days.

(21) Appl. No.: 15/601,039

(22) Filed: May 22, 2017

(65) Prior Publication Data
US 2018/0067880 A1 Mar. 8, 2018

(30) Foreign Application Priority Data
Sep. 7, 2016 (KR) .................. 10-2016-0114936

(51) Int. Cl.
*G06F 11/00* (2006.01)
*G06F 13/16* (2006.01)
(Continued)

(52) U.S. Cl.
CPC ...... *G06F 13/1694* (2013.01); *G06F 12/0246* (2013.01); *G11C 7/1006* (2013.01);
(Continued)

(58) Field of Classification Search
None
See application file for complete search history.

(56) References Cited

U.S. PATENT DOCUMENTS

| 10,135,460 | B2 * | 11/2018 | Ionita | ..................... H03M 5/18 |
| 2006/0168500 | A1 * | 7/2006 | Whinnett | ................ H04L 1/005 714/794 |

(Continued)

FOREIGN PATENT DOCUMENTS

| KR | 1020140006444 | 1/2014 |
| KR | 1020150108362 | 9/2015 |

OTHER PUBLICATIONS

Cho, S. et al., Block-Wise Concatenated BCH Codes for NAND Flash Memories, Apr. 2014, pp. 1164-1177, vol. 62, No. 4, IEEE.

*Primary Examiner* — Mujtaba M Chaudry
(74) *Attorney, Agent, or Firm* — IP & T Group LLP

(57) ABSTRACT

A controller may include a first encoder suitable for generating a first polar parity by performing a first polar encoding operation to respective first sections of an original message having a plurality of symbols, an interleaver suitable for generating an interleaved message by interleaving the original message according to first reliabilities, which are predetermined depending on locations of the respective symbols in the respective first sections in the original message, and second reliabilities, which are predetermined depending on locations of the respective symbols in the interleaved message, a second encoder suitable for generating a second polar parity by performing a second polar encoding operation to respective second sections included in the interleaved message and a memory interface suitable for storing the original message, the first polar parity and the second polar parity into a memory.

19 Claims, 12 Drawing Sheets

(51) Int. Cl.
*G06F 12/02* (2006.01)
*G11C 7/10* (2006.01)
*G11C 11/4091* (2006.01)
*G11C 11/56* (2006.01)
*G11C 16/04* (2006.01)
*G11C 16/26* (2006.01)
*G06F 12/06* (2006.01)

(52) U.S. Cl.
CPC ........ *G11C 7/1042* (2013.01); *G11C 11/4091* (2013.01); *G11C 11/5642* (2013.01); *G11C 16/0483* (2013.01); *G11C 16/26* (2013.01); *G06F 12/0607* (2013.01); *G06F 2212/1032* (2013.01); *G06F 2212/7202* (2013.01)

(56) References Cited

U.S. PATENT DOCUMENTS

| | | | | |
|---|---|---|---|---|
| 2010/0220799 | A1* | 9/2010 | Zheng | H04L 1/1819 375/261 |
| 2012/0084620 | A1* | 4/2012 | Miyazaki | H04L 1/0065 714/752 |
| 2012/0089885 | A1* | 4/2012 | Grube | H03M 13/05 714/752 |
| 2013/0024605 | A1* | 1/2013 | Sharon | G06F 11/1072 711/103 |
| 2013/0151911 | A1* | 6/2013 | Dick | H04L 1/0051 714/704 |
| 2014/0040214 | A1* | 2/2014 | Ma | H03M 7/30 707/693 |
| 2015/0091742 | A1* | 4/2015 | Ionita | H03M 5/18 341/57 |
| 2015/0349909 | A1* | 12/2015 | El-Khamy | H04W 72/0466 370/335 |
| 2016/0204811 | A1* | 7/2016 | Goela | H04B 1/123 375/260 |

* cited by examiner

<IDEAL>

CONTROLLER AND OPERATING METHOD THEREOF

CROSS-REFERENCE TO RELATED APPLICATIONS

The present application claims priority to Korean Patent Application No. 10-2016-0114936, filed on Sep. 7, 2016, which is incorporated herein by reference in its entirety.

BACKGROUND

1. Field

Various exemplary embodiments of the present invention relate to a controller and an operating method thereof.

2. Description of the Related Art

In general, semiconductor memory devices are classified into volatile memory devices, such as Dynamic Random Access Memory (DRAM) and Static RAM (SRAM), and non-volatile memory devices, such as Read Only Memory (ROM), Mask ROM (MROM), Programmable ROM (PROM), Erasable PROM (EPROM), Electrically EPROM (EEPROM), Ferromagnetic RAM (FRAM), Phase change RAM (PRAM), Magnetic RAM (MRAM), Resistive RAM (RRAM) and flash memory.

Volatile memory devices lose their stored data when their power supplies are interrupted, whereas non-volatile memory devices retain their stored data even when their power supplies are interrupted. Non-volatile flash memory devices are widely used as storage mediums in computer systems due to their high program speed, low power consumption and large data storage capacity.

In non-volatile memory devices, especially in flash memory devices, the data state of each memory cell depends on the number of bits that the memory cell can program. A memory cell storing 1-bit data per cell is called a single-bit cell or a single-level cell (SLC). A memory cell storing multi-bit data that is, 2 or more bits data per cell is called a multi-bit cell, a multi-level cell (MLC) or a multi-state cell. An MLC is advantageous for high integration. However, as the number of bits programmed in each memory cell increases, the reliability decreases and the read failure rate increases.

For example, when k bits are programmed in a memory cell, one of $2^k$ threshold voltages is formed in the memory cell. Due to minute differences between the electrical characteristics of memory cells, the threshold voltages of memory cells programmed for the same data form threshold voltage distributions. Threshold voltage distributions correspond to $2^k$ data values corresponding to k-bit information, respectively.

However, a voltage window available for threshold voltage distributions is finite. Therefore, as the value k increases, the distance between the threshold voltage distributions decreases and the neighbouring threshold voltage distributions may overlap. As the neighbouring threshold voltage distributions overlap, read data may include error bits.

FIG. 1 is a threshold voltage distribution schematically illustrating program and erase states of a 3-bit MLC non-volatile memory device.

FIG. 2 is a threshold voltage distribution schematically illustrating program and erase states due to characteristic deterioration of the 3-bit MLC non-volatile memory device.

In an MLC non-volatile memory device, for example, an MLC flash memory device capable of storing k-bit data in a single memory cell, the memory cell may have one of $2^k$ threshold voltage distributions. For example, the 3-bit MLC has one of 8 threshold voltage distributions.

Threshold voltages of memory cells programmed for the same data form a threshold voltage distribution due to characteristic differences between memory cells. In the 3-bit MLC non-volatile memory device, as illustrated in FIG. 1, threshold voltage distributions are formed in correspondence with the data states including 7 program states 'P1' to 'P7' and an erase state 'E'. FIG. 1 illustrates an ideal case in which threshold voltage distributions do not overlap and have sufficient read voltage margins therebetween.

Referring to the flash memory example of FIG. 2, the memory cell may experience charge loss in which electrons trapped at a floating gate or tunnel oxide film are discharged over time. Such charge loss may accelerate when the tunnel oxide film deteriorates by iterative program and erase operations. Charge loss results in a decrease in the threshold voltages of memory cells. For example, as illustrated in FIG. 2, the threshold voltage distribution may be shifted left due to charge loss.

Further, program disturbance, erase disturbance and/or back pattern dependency may cause increases in threshold voltages. As characteristics of memory cells deteriorate, neighbouring threshold voltage distributions may overlap, as illustrated in FIG. 2.

Once neighbouring threshold voltage distributions overlap, read data may include a significant number of errors when a particular read voltage is applied to a selected word line. For example, when a sensed state of a memory cell according to a read voltage Vread3 that is applied to a selected word line is on, the memory cell is determined to have a second program state 'P2'. When a sensed state of a memory cell according to a read voltage Vread3 applied to a selected word line is off, the memory cell is determined to have a third program state 'P3'. However, when neighbouring threshold voltage distributions overlap, a memory cell that has the third program state 'P3' may be erroneously determined to have the second program state 'P2'. That is, when the neighbouring threshold voltage distributions overlap as illustrated in FIG. 2, read data may include a significant number of errors.

Therefore, what is required is a method for precisely reading data stored in memory cells of a semiconductor memory device.

SUMMARY

Various embodiments of the present invention are directed to a controller capable of precisely reading data stored in memory cells of the semiconductor memory device, and an operating method thereof.

In accordance with an embodiment of the present invention, a controller may include: a first encoder suitable for generating a first polar parity by performing a first polar encoding operation to respective first sections of an original message having a plurality of symbols; an interleaver suitable for generating an interleaved message by interleaving the original message according to first reliabilities, which are predetermined depending on locations of the respective symbols in the respective first sections in the original message, and second reliabilities, which are predetermined depending on locations of the respective symbols in the interleaved message; a second encoder suitable for generating a second polar parity by performing a second polar encoding operation to respective second sections included in the interleaved message; and a memory interface suitable for storing the original message, the first polar parity and the second polar parity into a memory.

Preferably, the interleaver may interleave the original message such that one of the first and second reliabilities of the respective symbols is equal to or higher than a predetermined reliability.

Preferably, the interleaver may interleave the original message such that, among the plurality of symbols, a symbol having the first reliability of relatively lower value than the other symbols in the original message are interleaved to have the second reliability of relatively higher value than the other symbols in the interleaved message.

Preferably, the interleaver may interleave the original message such that an order of the second reliabilities of the symbols in the interleaved message is reversed from an order of the first reliabilities of the symbols in the original message.

Preferably, a number of the first sections may be different from a number of the second sections.

Preferably, a number of the first sections may be the same as a number of the second sections.

Preferably, the second encoder may further generate an additional second polar parity by performing the second polar encoding operation to the first polar parity.

In accordance with an embodiment of the present invention, an operation method of a controller may include: performing a first polar decoding operation to respective first sections included in an original message by using a first polar parity, wherein the original message and the first polar parity are included in a codeword; interleaving, when the first polar decoding operation fails, the original message, to which the first polar decoding operation is performed, according to first reliabilities, which are predetermined depending on locations of the respective symbols in the respective first sections in the original message, and second reliabilities, which are predetermined depending on locations of the respective symbols in the interleaved message; performing a second polar decoding operation to respective second sections included in the interleaved original message by using a second polar parity; de-interleaving, when the second polar decoding operation fails, the original message, to which the second polar decoding operation is performed; and performing the first polar decoding operation to the respective first sections of the de-interleaved original message by using the first polar parity.

Preferably, the interleaving of the original message may be performed such that one of the first and second reliabilities of the respective symbols is equal to or higher than a predetermined reliability.

Preferably, the interleaving of the original message may be performed such that, among the plurality of symbols, a symbol having the first reliability of relatively lower value than the other symbols in the original message are interleaved to have the second reliability of relatively higher value than the other symbols in the interleaved message.

Preferably, the interleaving of the original message may be performed such that an order of the second reliabilities of the symbols in the original message is reversed from an order of the first reliabilities of the symbols in the interleaved message.

Preferably, a number of the first sections may be different from a number of the second sections.

Preferably, a number of the first sections may be the same as a number of the second sections.

In accordance with an embodiment of the present invention, a controller may include: a first decoder suitable for performing a first polar decoding operation to respective first sections included in an original message by using a first polar parity, wherein the original message and the first polar parity are included in a codeword; an interleaver suitable for interleaving, when the first polar decoding operation fails, the original message, to which the first polar decoding operation is performed, according to first reliabilities, which are predetermined depending on locations of the respective symbols in the respective first sections in the original message, and second reliabilities, which are predetermined depending on locations of the respective symbols in the interleaved message; and a second decoder suitable for performing a second polar decoding operation to respective second sections included in the interleaved original message by using a second polar parity, wherein the interleaver further de-interleaves, when the second polar decoding operation fails, the original message, to which the second polar decoding operation is performed, and wherein the first decoder further performs the first polar decoding operation to the respective first sections of the de-interleaved original message by using the first polar parity.

Preferably, the interleaver may interleave the original message such that one of the first and second reliabilities of the respective symbols is equal to or higher than a predetermined reliability.

Preferably, the interleaver may interleave the original message such that, among the plurality of symbols, a symbol having the first reliability of relatively lower value than the other symbols in the original message are interleaved to have the second reliability of relatively higher value than the other symbols in the interleaved message.

Preferably, the interleaver may interleave the original message such that an order of the second reliabilities of the symbols in the original message is reversed from an order of the first reliabilities of the symbols in the interleaved message.

Preferably, a number of the first sections may be different from a number of the second sections.

Preferably, a number of the first sections may be the same as a number of the second sections.

In accordance with various embodiments of the present invention, data stored in memory cells of a semiconductor memory device may be precisely read.

BRIEF DESCRIPTION OF THE DRAWINGS

These and other features and/or advantages of the present invention will become apparent to those skilled in the art to which this invention belongs in view of the following description of various embodiments of the present invention in reference to the accompanying drawings in which.

DETAILED DESCRIPTION

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete and will fully convey the present invention to those skilled in the art. The scope of the present invention will be understood through the claims of the present invention.

It is noted that the drawings are not necessarily to scale and, in some instances, proportions may have been exaggerated in order to more clearly illustrate the various elements of the embodiments.

Also, in the following description, numerous specific details are set forth in order to provide a thorough understanding of the present invention. The present invention may be practiced without some or all of these specific details. In other instances, well-known process structures and/or processes have not been described in detail in order not to unnecessarily obscure the present invention.

It is also noted, that in some instances, as would be apparent to those skilled in the relevant art, an element also referred to as a feature described in connection with one embodiment may be used singly or in combination with other elements of another embodiment, unless specifically indicated otherwise.

Hereinafter, the various embodiments of the present invention will be described in detail with reference to the attached drawings.

Figure 1:
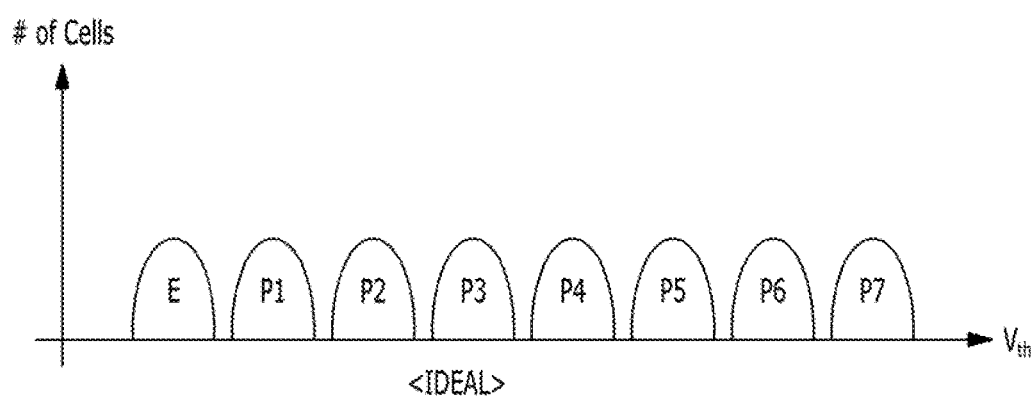
FIG. 1 is a threshold voltage distribution schematically illustrating program and erase states of a 3-bit MLC non-volatile memory device.
Figure 2:
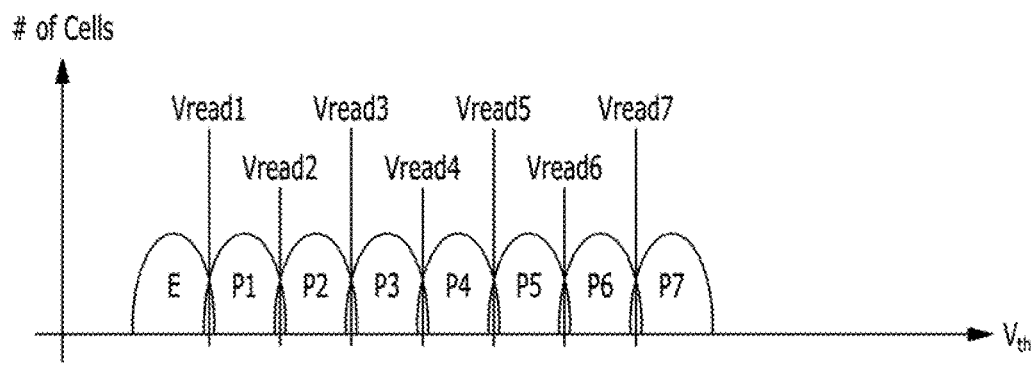
FIG. 2 is a threshold voltage distribution schematically illustrating program and erase states due to characteristic deterioration of a 3-bit MLC non-volatile memory device.
Figure 3:
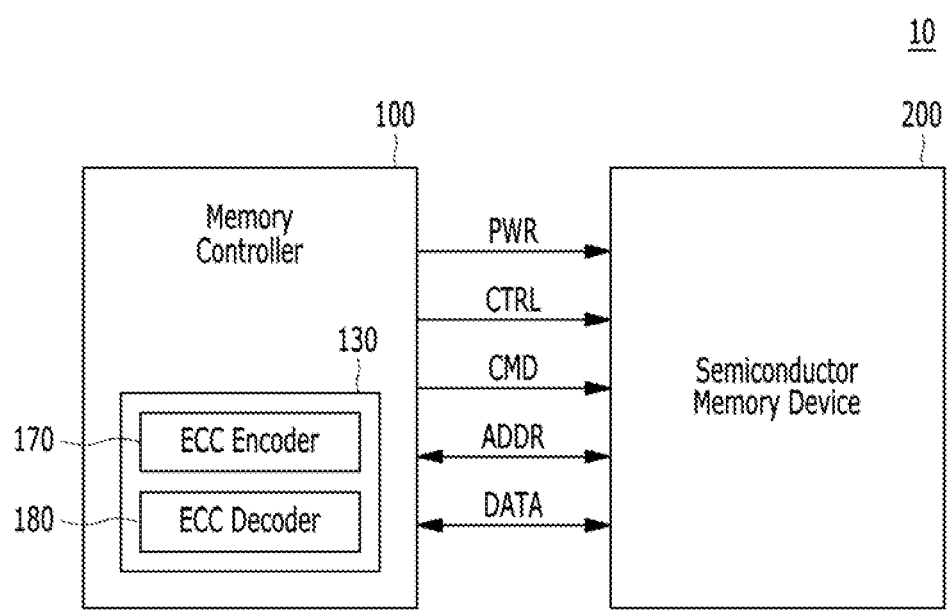
FIG. 3 is a block diagram schematically illustrating a semiconductor memory system, in accordance with an embodiment of the present invention.
Figure 4A:
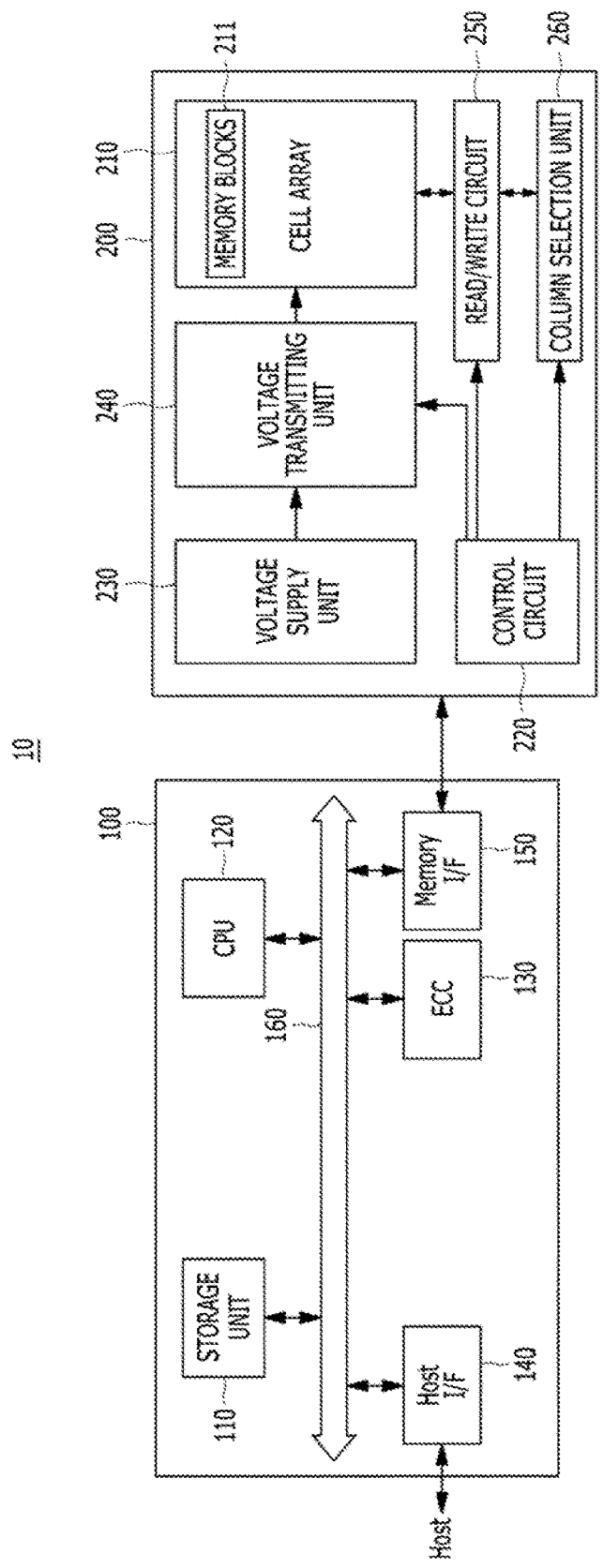
FIG. 4A is a detailed block diagram illustrating a semiconductor memory system of FIG. 3.
Figure 4B:
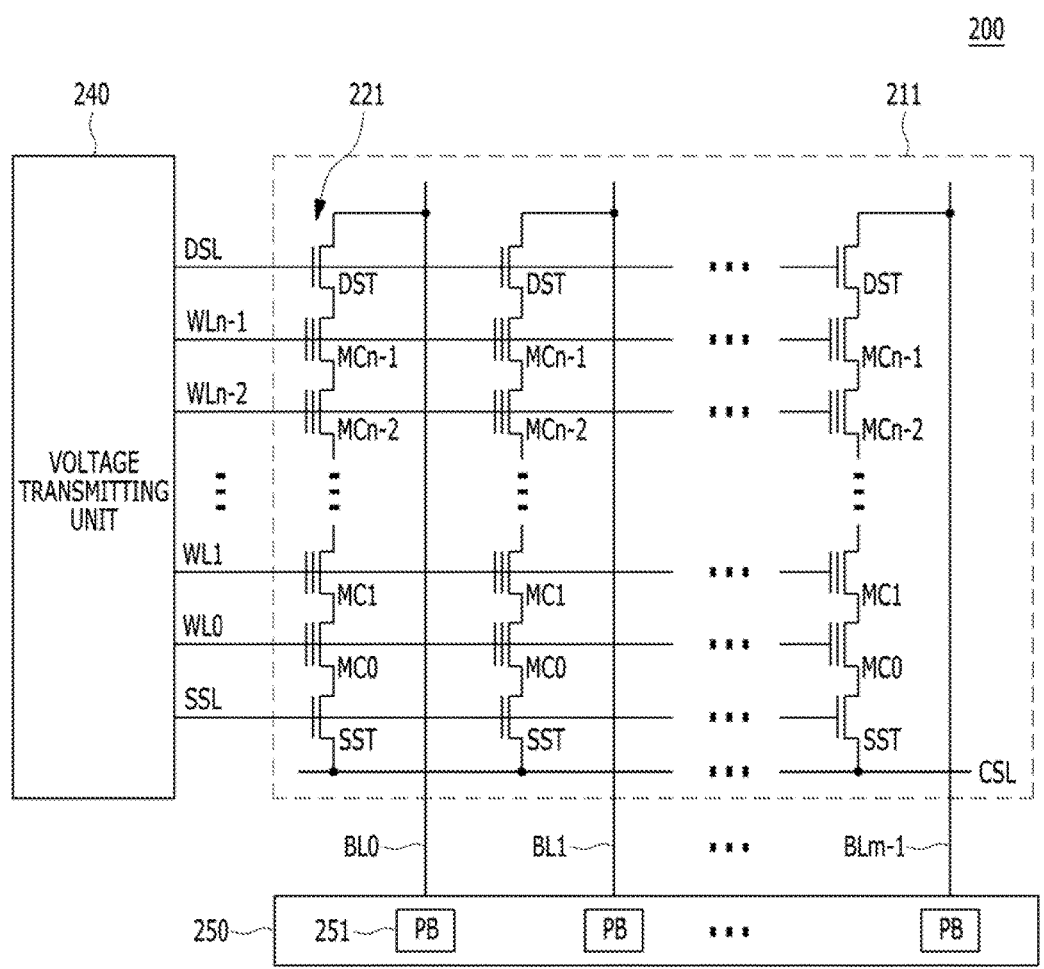
FIG. 4B is a circuit diagram illustrating an exemplary configuration of a memory block employed in the semiconductor memory system of FIG. 4A.
Figure 5:
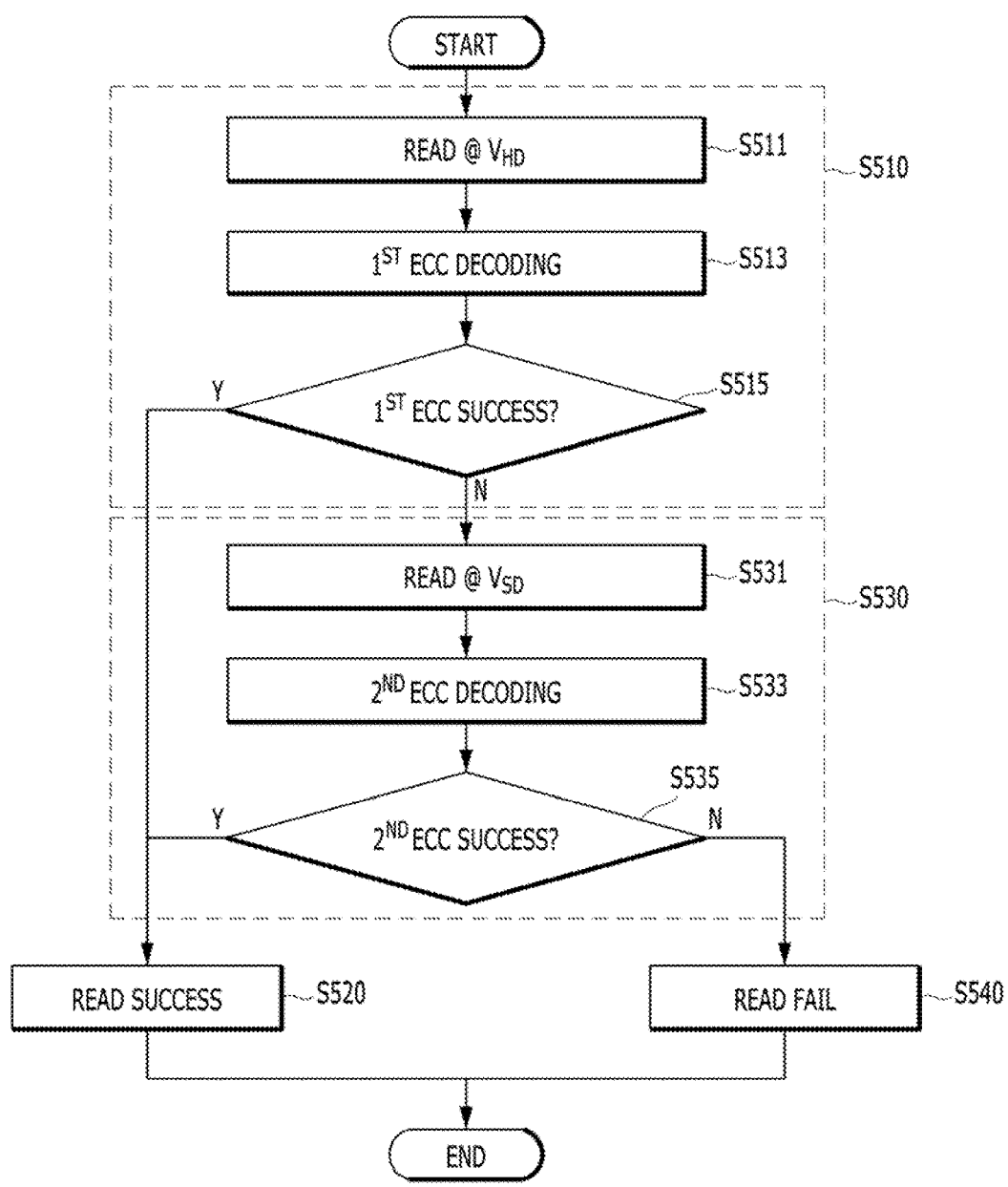
FIG. 5 is a flowchart illustrating an operation of a memory controller employed in the semiconductor memory system shown in FIG. 4A.

FIG. 3 is a block diagram schematically illustrating a semiconductor memory system 10 in accordance with an embodiment of the present invention. FIG. 4A is a detailed block diagram illustrating the semiconductor memory system 10 of FIG. 3. FIG. 4B is a circuit diagram illustrating an exemplary configuration of a memory block employed in the semiconductor memory system 10 of FIG. 4A. FIG. 5 is a flowchart illustrating an operation of a memory controller 100 employed in the semiconductor memory system shown in FIG. 4A.

Referring now to FIGS. 3 to 5, the semiconductor memory system 10 may include the semiconductor memory device 200 and the memory controller 100 operatively coupled to the semiconductor memory device 200.

The semiconductor memory device 200 may perform one or more of an erase, a program, and a read operation under the control of the memory controller 100. The semiconductor memory device 200 may receive a command CMD, an address ADDR and data DATA through a plurality of input/output lines from the memory controller 100. The semiconductor memory device 200 may receive power PWR through a power line and a control signal CTRL through a control line from the memory controller 100. The control signal may include a command latch enable (CLE) signal, an address latch enable (ALE) signal, a chip enable (CE) signal, a write enable (WE) signal, a read enable (RE) signal, and so on.

The memory controller 100 may control overall operations of the semiconductor memory device 200. The memory controller 100 may include an ECC unit 130 for correcting error bits. The ECC unit 130 may include an ECC encoder 170 and an ECC decoder 180.

The ECC encoder 170 may perform error correction encoding on data programmed into the semiconductor memory device 200 to output data to which parity bits are added. The encoded data with the parity bits may be stored in the semiconductor memory device 200.

The ECC decoder 180 may perform an error correction decoding operation on data read from the semiconductor memory device 200. The ECC decoder 180 may determine whether the error correction decoding operation is successful, and may output an instruction signal based on the determination result. The ECC decoder 180 may correct error bits of data using the parity bits generated by the ECC encoding operation.

The ECC unit 130 may perform an error correction operation based on a coded modulation such as a low density parity check (LDPC) code, a Bose-Chaudhuri-Hocquenghem (BCH) code, a turbo code, a Reed-Solomon (RS) code, a convolution code, a recursive systematic code (RSC), a trellis-coded modulation (TCM), a Block coded modulation (BCM), and so on. The ECC unit 130 may include all circuits, systems or devices for the error correction operation.

The ECC unit 130 may correct an error through a low-density parity-check (LDPC) code. The ECC unit 130 may include all circuits, systems, or devices for error correction.

When the number of error bits exceeds the error correction capacity of the ECC unit 130, the ECC unit 130 may not correct the error bits. In this case, the ECC unit 130 may generate an error correction fail signal.

The ECC unit 130 may perform an error bit correcting operation using hard decision read data and/or soft decision read data. In an embodiment, the ECC unit 130 may perform an error bit correcting operation using soft decision read data.

The memory controller 100 and the semiconductor memory device 200 may be integrated in a single semiconductor device. For example, the memory controller 100 and the semiconductor memory device 200 may be integrated in a single semiconductor device such as a solid-state drive (SSD). The solid state drive may include a storage device for storing data in a semiconductor memory. When the semiconductor memory system 10 is used in an SSD, operation speed of a host (not shown) coupled to the semiconductor memory system 10 may be remarkably improved.

The memory controller 100 and the semiconductor memory device 200 may be integrated in a single semiconductor device such as a memory card. For example, the memory controller 100 and the semiconductor memory device 200 may be integrated in a single semiconductor device to configure a memory card such as a PC card of personal computer memory card international association (PCMCIA), a compact flash (CF) card, a smart media (SM) card, a memory stick, a multimedia card (MMC), a reduced-size multimedia card (RS-MMC), a micro-size version of MMC (MMCmicro), a secure digital (SD) card, a mini secure digital (miniSD) card, a micro secure digital (microSD) card, a secure digital high capacity (SDHC), and a universal flash storage (UFS).

For another example, the semiconductor memory system 10 may be provided as one of various elements comprising an electronic apparatus such as a computer, an ultra-mobile PC (UMPC), a workstation, a net-book computer, a personal digital assistants (PDA), a portable computer, a web tablet PC, a wireless phone, a mobile phone, a smart phone, an e-book reader, a portable multimedia player (PMP), a portable game device, a navigation device, a black box, a digital camera, a digital multimedia broadcasting (DMB) player, a 3-dimensional television, a smart television, a digital audio recorder, a digital audio player, a digital picture recorder, a digital picture player, a digital video recorder, a digital video player, a storage device of a data center, a device capable of receiving and transmitting information in a wireless environment, one of electronic devices of a home network, one of electronic devices of a computer network, one of electronic devices of a telematics network, an radio-frequency identification (RFID) device, or of a computing system.

Referring to FIG. 4A, in an embodiment, the memory controller 100 may include, in addition to the ECC unit 130, a storage unit 110, a CPU 120, a host interface 140, a memory interface 150 and a system bus 160.

The storage unit 110 may operate as a working memory of the CPU 120.

The host interface 140 may communicate with a host through one or more of various interface protocols such as a universal serial bus (USB), a multi-media card (MMC), a peripheral component interconnect express (PCI-E), a small computer system interface (SCSI), a serial-attached SCSI (SAS), a serial advanced technology attachment (SATA), a parallel advanced technology attachment (PATA), an enhanced small disk interface (ESDI), and an integrated drive electronics (IDE).

The ECC unit 130 may detect and correct errors included in the data read from the semiconductor memory device 200. The memory interface 150 may interface with the semiconductor memory device 200. The ECC encoder 170 and the ECC decoder 180 may be implemented as different and independent components even though FIG. 4A exemplarily shows the ECC unit 130 including both of the ECC encoder 170 and the ECC decoder 180. The CPU 120 may perform various control operations.

In accordance with an exemplary embodiment of the present invention, during a program operation, the ECC unit 130 may perform an ECC encoding operation to an original data which is to be programmed to the semiconductor memory device 200. In such case, during the read operation, the ECC unit 130 may perform an ECC decoding operation to the ECC-encoded data or a codeword, which is stored in the semiconductor memory device 200.

An original data is data as received from the host before being encoded ECC by the encoding operation of the ECC unit 130 during a program operation. The ECC-encoded data are stored in the semiconductor memory device 200. The ECC unit 130 may then restore the original data by performing an ECC decoding operation to the ECC-encoded data or the codeword stored in the semiconductor memory device 200.

As discussed with reference to FIG. 5, the read operation to the data stored in the semiconductor memory device 200 may include a hard decision read operation of step S511 and a soft decision read operation of step S531. During the hard decision read operation, data may be read from the semiconductor memory device 200 according to a hard decision read voltage $V_{HD}$. During the soft decision read operation, data may be read from the semiconductor memory device 200 according to soft decision read voltages $V_{SD}$, which have different levels than the hard decision read voltage $V_{HD}$. For example, an additional read operation according to the soft decision read voltages $V_{SD}$ may be performed to the memory cell, which is read according to the hard decision read voltage $V_{HD}$.

The ECC-encoded data or the codeword, which is stored in the semiconductor memory device 200 and is read through the hard decision read operation, may be decoded back to the original data by the ECC unit 130.

The soft decision read operation includes generating a log likelihood ratio (LLR), which provides the reliability of the hard decision read data read through the hard decision read operation, according to the soft decision read voltages $V_{SD}$ rather than being just the read operation to data stored in the semiconductor memory device 200.

The ECC unit 130 may perform the ECC decoding operation to the LLR. The ECC unit 130 may detect and correct the error of the ECC-encoded data or the codeword read from the semiconductor memory device 200 through the LLR scheme.

The semiconductor memory device 200 may include a memory cell array 210, a control circuit 220, a voltage supply unit 230, a voltage transmitting unit 240, a read/write circuit 250, and a column selection unit 260.

The memory cell array 210 may include a plurality of memory blocks 211. User data may be stored in the memory block 211. The user data may be encoded as described above.

Referring to FIG. 4B, an exemplary configuration of the memory block 211 may include a plurality of cell strings 221 coupled to bit lines BL0 to BLm−1, respectively. The cell string 221 of each column may include one or more drain selection transistors DST and one or more source selection transistors SST. A plurality of memory cells or memory cell transistors may be serially coupled between the selection transistors DST and SST. Each of the memory cells MC0 to MCn−1 may be preferably formed of a multi-level cell (MLC) storing data information of multiple bits in each cell.

The cell strings 221 may be electrically coupled to the corresponding bit lines BL0 to BLm−1, respectively.

FIG. 4B exemplarily illustrates a memory block 211 comprising a NAND-type flash memory cell. However, the memory block 211 of the semiconductor memory device 200 is not limited to being NAND flash memory. For example, the memory block 211 may comprise a NOR-type flash memory, a hybrid flash memory in which two or more types of memory cells are combined, and one-NAND flash memory in which a controller is embedded inside a memory chip. Operation characteristics of the semiconductor device may be applied to a charge trap flash (CTF) in which a charge storing layer is formed by an insulating layer, as well as the flash memory device in which a charge storing layer is formed by a conductive floating gate.

Referring back to FIG. 4A, the control circuit 220 may control overall operations including operations related to program, erase, and read operations of the semiconductor memory device 200.

The voltage supply unit 230 may provide word line voltages, for example, a program voltage, a read voltage, and a pass voltage, to the respective word lines according to an operation mode, and may provide a voltage supplied to a bulk, for example, a well region in which the memory cells are formed. A voltage generating operation of the voltage supply circuit 230 may be performed under control of the control circuit 220.

The voltage supply unit 230 may generate a plurality of variable read voltages for generating a plurality of read data.

The voltage transmitting unit 240 may select one of the memory blocks 211 or sectors of the memory cell array 210, and may select one of the word lines of the selected memory block under the control of the control circuit 220. The voltage transmitting unit 240 may provide the word line voltage generated from the voltage supply circuit 230 to selected word lines or non-selected word lines under the control of the control circuit 220.

The read/write circuit 250 may be controlled by the control circuit 220 and may operate as a sense amplifier or a write driver according to an operation mode. For example, during a verification/normal read operation, the read/write circuit 250 may operate as a sense amplifier for reading data from the memory cell array 210. During a normal read operation, the column selection unit 260 may output the data read from the read/write circuit 250 to the outside, for example, to the memory controller 100, based on column address information. Alternatively, during a verification read operation, the read data may be provided to a pass/fail verification circuit (not illustrated) included in the semiconductor memory device 200, and may be used for determining whether a program operation of the memory cell succeeds.

During a program operation, the read/write circuit 250 may operate as a write driver for driving the bit lines according to data in the memory cell array 210. During a program operation, the read/write circuit 250 may receive data to be written in the memory cell array 210 from a buffer (not illustrated), and may drive the bit lines according to the input data. To this end, the read/write circuit 250 may include a plurality of page buffers (PB) 251 corresponding to the columns or the bit lines or column pairs or bit line pairs, respectively. A plurality of latches may be included in each of the page buffers 251.

Referring to FIGS. 4A and 5, the operation of the memory controller 100 may include a hard decision decoding step S510, and may additionally include a soft decision decoding step S530. A target data of the hard and soft decision decoding steps S510 and S530, or the data stored in the semiconductor memory device 200 may be the ECC-encoded data or the codeword, which is ECC-encoded by the ECC unit 130.

For example, the hard decision decoding step S510 may be a step of a hard decision ECC decoding operation for hard decision read data of predetermined length, which is read from a memory cell of the memory block 211 according to the hard decision read voltage $V_{HD}$. The hard decision decoding step S510 may include steps S511 to S515.

For example, the soft decision decoding step S530 may be a step of a soft decision ECC decoding operation for the hard decision read data by forming soft decision read data according to soft decision read voltages $V_{SD}$ around the hard decision read voltage $V_{HD}$ when the hard decision ECC decoding operation of the hard decision decoding step S510 finally fails. The soft decision decoding step S530 may include steps S531 to S535.

As described above, at step S511 of the hard decision read step, the hard decision read data may be read from the semiconductor memory device 200 according to the hard decision read voltage $V_{HD}$. The memory controller 100 may provide a read command and an address to the semiconductor memory device 200. The semiconductor memory device 200 may read the hard decision read data therefrom according to the hard decision read voltage $V_{HD}$ in response to the read command and the address. The read hard decision read data may be provided to the memory controller 100.

At step S513, a first error correction decoding operation is performed which may be a hard decision ECC decoding operation. The ECC unit 130 may perform the hard decision ECC decoding operation to the hard decision read data, which is read from the semiconductor memory device 200 according to the hard decision read voltage $V_{HD}$ by using the error correction code.

At step S515, it may be determined whether the first error correction decoding operation, that is, the hard decision ECC decoding operation is a success or a fail. At step S515, it may be determined whether an error of the hard decision read data, to which the hard decision ECC decoding operation is performed at step S513, is corrected. For example, the memory controller 100 may determine whether an error of the hard decision read data is corrected by using the hard decision read data and a parity check matrix. For example, when product result of the parity check matrix and the hard decision read data is a zero vector ('0'), it may be determined that the hard decision read data is corrected. On the other hand, when the product result of the parity check matrix and the hard decision read data is not the zero vector ('0'), it may be determined that the hard decision read data is not corrected.

When it is determined that the hard decision read data is corrected as the result of the determination of step S515, it may be determined at step S520 that the read operation according to hard decision read voltage $V_{HD}$ at step S511 is successful and the operation of the memory controller 100 may end. The hard decision read data, to which the hard decision ECC decoding operation is performed at step S513, may be now the error-corrected data and may be provided externally or used in the memory controller 100.

When it is determined that the hard decision read data is not corrected as the result of the determination of step S515, a second error correction decoding operation may be performed in step S530 which may be a soft decision decoding operation.

As described above, at step S531 of the soft decision read step, the soft decision read data may be read from the semiconductor memory device 200 according to the soft decision read voltages $V_{SD}$. For example, the additional read operation according to the soft decision read voltages $V_{SD}$ may be performed to the memory cell, to which the hard decision decoding step S510 is performed according to the hard decision read voltage $V_{HD}$. The soft decision read voltages $V_{SD}$ may be different from the hard decision read voltage $V_{HD}$.

At step S533, the soft decision ECC decoding operation as the second error correction decoding operation may be performed. The soft decision ECC decoding operation may be performed based on the soft decision read data comprising the hard decision read data, to which the hard decision ECC decoding operation is performed, and data read from the memory cell according to the soft decision read voltages $V_{SD}$. The hard decision read voltage $V_{HD}$ and the soft decision read voltages $V_{SD}$ may be different.

For example, each of the memory cells MC0 to MCn-1 of the semiconductor memory device 200 may belong to one of the threshold voltage distributions including 7 program states P1 to P7 and 1 erase state E.

The hard decision read voltage $V_{HD}$ may have a level between 2 neighbouring states of the plurality of states E and P1 to P7. Each of the soft decision read voltages $V_{SD}$ may have a level, which is different from the hard decision read voltage $V_{HD}$, between 2 neighbouring states of the plurality of states E and P1 to P7.

The hard decision read data read from the memory cells MC0 to MCn-1 according to the hard decision read voltage $V_{HD}$ and the soft decision read data read therefrom according to the soft decision read voltages $V_{SD}$ may have different values. For example, there may be a tailed memory cell among the memory cells MC0 to MCn-1 having a threshold voltage that is higher or lower than the threshold voltage distribution of the normal logic state. The hard decision read data read from the tailed memory cell according to the hard decision read voltage $V_{HD}$ and the soft decision read data read therefrom according to the soft decision read voltages $V_{SD}$ may have different values. When the additional read operation according to the soft decision read voltages $V_{SD}$ is performed as well as the read operation according to the hard decision read voltage $V_{HD}$, additional information on the threshold voltages of the memory cells MC0 to MCn-1 that is, additional information on the tailed memory cells or the log likelihood ratio (LLR) providing reliability of the hard decision read data read by the hard decision read operation may be obtained.

When the additional information is obtained, the probability of the likelihood ratio whether the data of the memory cells MC0 to MCn-1 belong to the first state that is, '1', or the second state that is, '0', may increase. The reliability of the ECC decoding operation may increase. The memory controller 100 may perform the soft decision ECC decoding operation based on the soft decision read data, which is read according to the hard decision read voltage $V_{HD}$ and the soft decision read voltages $V_{SD}$. The relationship between the hard decision read voltage $V_{HD}$ and the soft decision read voltages $V_{SD}$ will be disclosed with reference to FIGS. 6 and 7.

At step S535, it may be determined whether the second error decoding operation, that is, the soft decision ECC decoding operation succeeds or fails. At step S535, it may be determined whether an error of the soft decision read data, to which the soft decision ECC decoding operation is performed at step S533, is corrected. For example, the memory controller 100 may determine whether an error of the soft decision read data is corrected by using the soft decision read data and the parity check matrix. For example, when the result of the parity check matrix and the soft decision read data is a zero vector ('0'), it may be determined that the soft decision read data, to which the soft decision ECC decoding operation is performed, is corrected. Alternatively, when the result of the parity check matrix and the soft decision read data is not a zero vector ('0'), it may be determined that the soft decision read data, to which the soft decision ECC decoding operation is performed, is not corrected.

The product process of the parity check matrix and the hard decision read data during the hard decision decoding step S510 may be the same as the product process of the parity check matrix and the soft decision read data during the soft decision decoding step S530. The product process may be the matrix product.

When it is determined that the soft decision read data is corrected as the result of determination of step S535, it may be determined at step S520 that the read operation according to soft decision read voltage $V_{SD}$ at step S531 is successful and the operation of the memory controller 100 may end. The soft decision read data, to which the soft decision ECC decoding operation is performed at step S533, may be the error-corrected data and may be provided externally or used in the memory controller 100.

When it is determined that the soft decision read data is not corrected as the result of determination of step S535, it may be determined at step S540 that the read operation of the memory controller 100 to the memory cells MC0 to MCn-1 finally falls and the operation of the memory controller 100 may end.

Figure 6:
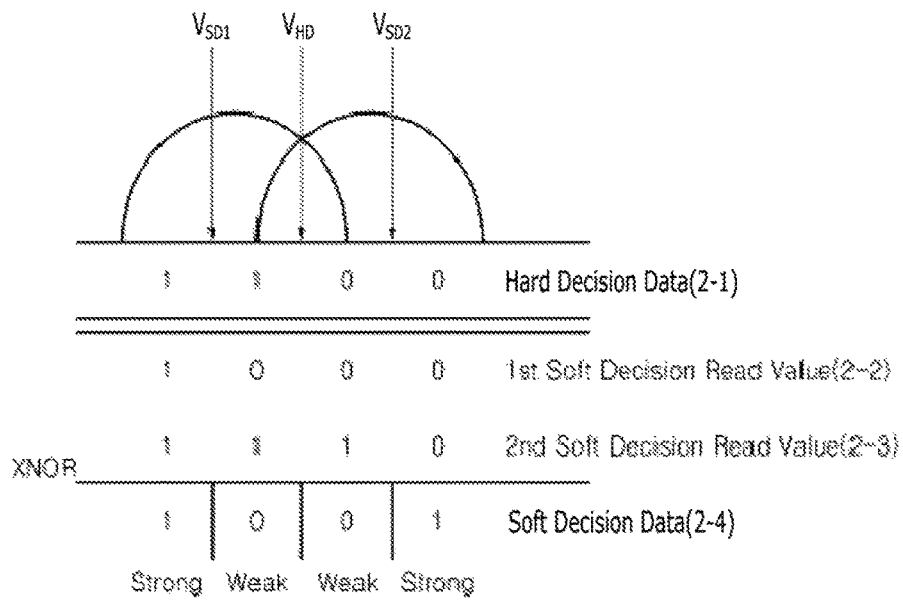
FIG. 6 is a schematic diagram illustrating a 2-bit soft decision read operation as a soft decision read operation shown in FIG. 5.
Figure 7:
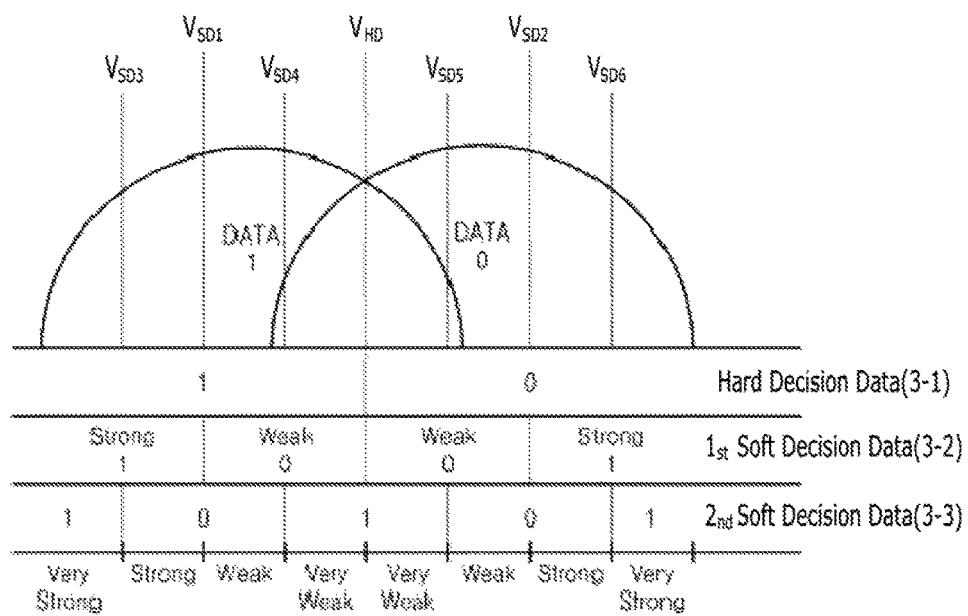
FIG. 7 is a schematic diagram illustrating a 3-bit soft decision read operation as a soft decision read operation shown in FIG. 5.

FIGS. 6 and 7 are schematic diagrams illustrating the soft decision read operation shown in FIG. 5, particularly 2-bit and 3-bit soft decision read operations, respectively.

Referring to FIG. 6, during the hard decision decoding operation of step S510 described with reference to FIG. 5, the hard decision read data 2-1 may have one of values '1' and '0' according to the on/off state of the memory cell when the hard decision read voltage $V_{HD}$ is applied to the semiconductor memory device 200.

During the soft decision decoding operation of step S530, the LLR may be generated through the soft decision read operation where the soft decision read voltages $V_{SD1}$ and $V_{SD2}$, which have different levels from the hard decision read voltage $V_{HD}$, are applied to the memory cell.

Referring to FIG. 6, during the 2-bit soft decision read operation, a first soft decision read value 2-2 may be '1000' according to the on/off status of a memory cell when the first soft decision read voltage $V_{SD1}$ is applied to the memory cell. In a similar way, a second soft decision read value 2-3 may be '1110' according to the on/off status of the memory cell when the second soft decision read voltages $V_{SD2}$ is applied to the memory cell.

For example, the ECC unit 130 may generate a soft decision read data 2-4 or the LLR through the XNOR operation to the first and second soft decision read values 2-2 and 2-3. The LLR 2-4 may show reliability of the hard decision read data 2-1.

For example, the value '1' of the soft decision read data 2-4 may show a "strong" probability of the first and second statuses, the logic values of '1' and '0', of the hard decision read data 2-1. Alternatively, the value '0' of the soft decision read data 2-4 may show a "weak" probability of the first and second statuses of the hard decision read data 2-1.

Referring to FIG. 7, during the hard decision decoding operation of step S510 described with reference to FIG. 5, the hard decision read data 3-1 may have one of values '1' and '0' according to the on/off state of the memory cell when the hard decision read voltage $V_{HD}$ is applied to the semiconductor memory device 200.

During the soft decision decoding operation of step S530, the LLR may be generated through the soft decision read operation where the soft decision read voltages $V_{SD1}$ to $V_{SD6}$, which have different levels from the hard decision read voltage $V_{HD}$, are applied to the memory cell.

Referring to FIG. 7, during the 3-bit soft decision read operation, first and second soft decision read values may be generated according to the on/off status of a memory cell when first and second soft decision read voltages $V_{SD1}$ and $V_{SD2}$ are applied to the memory cell, which is similar to the 2-bit soft decision read operation described with reference to FIG. 6. The ECC unit 130 may generate a first soft decision read data 3-2 '1001' or the LLR through an XNOR operation to the first and second soft decision read values.

In a similar way, during the 3-bit soft decision read operation, third to sixth soft decision read values may be generated according to the on/off status of the memory cell when third to sixth soft decision read voltages $V_{SD3}$ to $V_{SD6}$, which have different levels from the first and second soft decision read voltages $V_{SD1}$ and $V_{SD2}$ are applied to the memory cell, which is similar to the 2-bit soft decision read operation described with reference to FIG. 6. The ECC unit 130 may generate a second soft decision read data 3-3 ('10101') or the LLR through the XNOR operation to the third to sixth soft decision read values. The LLR 3-3 ('10101') may provide a weighted value to the first soft decision read data 3-2.

For example, the value '1' of the second soft decision read data 3-3 may show a "very strong" probability of the first status, the logic value of '1', of the first soft decision read data 3-2. Alternatively, the value '0' of the second soft decision read data 3-3 may show a "strong" probability of the first status of the first soft decision read data 3-2.

In a similar way, the value '1' of the second soft decision read data 3-3 may show a "very weak" probability of the second status, the logic value of '0', of the first soft decision read data 3-2. Alternatively, the value '0' of the second soft decision read data 3-3 may show a "weak" probability of the second status of the first soft decision read data 3-2. The LLR 3-3 may provide a better reliability to the hard decision read data 3-1, which is similar to the 2-bit soft decision read operation described with reference to FIG. 6.

Figure 8A:
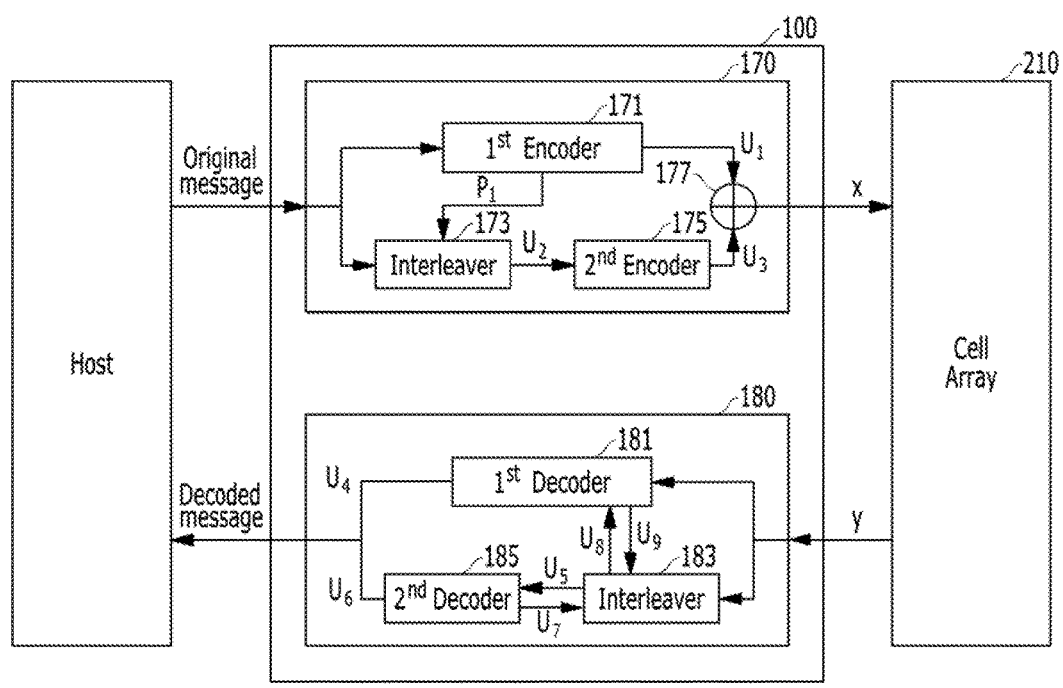
FIG. 8A is a detailed block diagram illustrating an ECC encoder and an ECC decoder of FIG. 3.

FIG. 8A is a detailed block diagram illustrating the ECC encoder 170 and the ECC decoder 180 in accordance with an embodiment of the present invention.

Figure 8B:
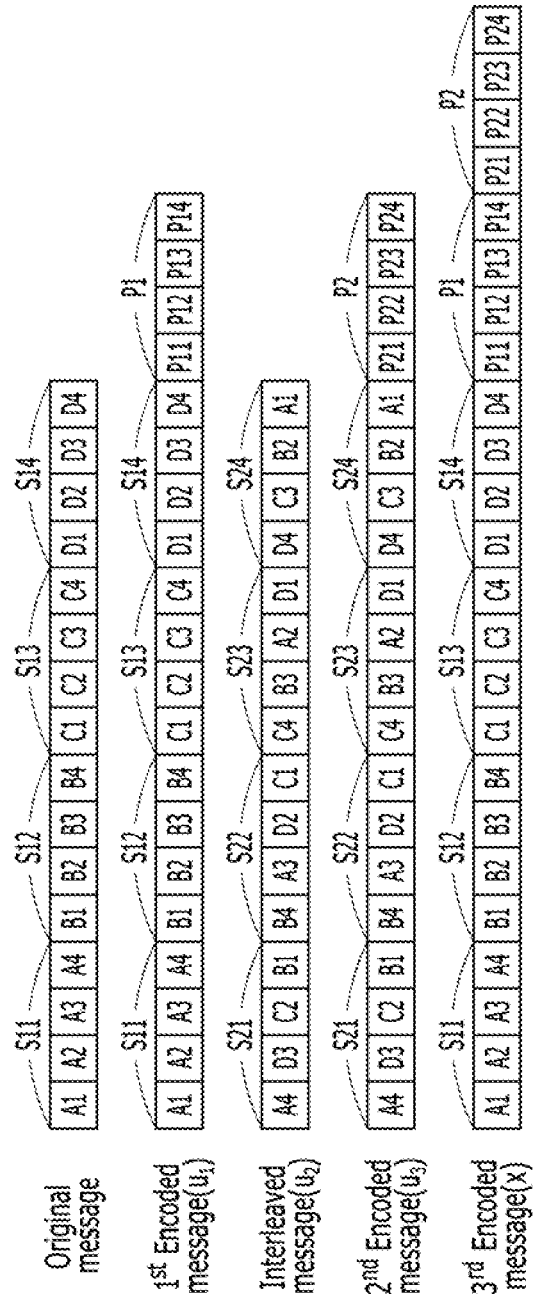
FIG. 8B is a diagram illustrating an original message, a first encoded message, an interleaved message, a second encoded message and a third encoded message.

FIG. 8B is a diagram illustrating an original message, a first encoded message, an interleaved message, a second encoded message and a third encoded message.

Hereinafter, described with reference to FIGS. 8A and 8B will be the ECC encoder 170.

Referring to FIG. 8A, the ECC encoder 170 may include a first encoder 171, an interleaver 173, a second encoder 175 and a summing unit 177.

The first encoder 171 may generate a first polar parity P1 for plural first sections of an original message provided from a host by performing a first polar encoding operation to the respective first sections of the original message, and therefor may generate a first encoded message. The first encoded message may include the original message and a first polar parity message, and the first polar parity message may include the first polar parities for the respective first sections of the original message.

The first encoder 171 may perform the first polar encoding operation to the original message by multiplying each symbol included in the respective first sections of the original message to a generation matrix, which is generated on the basis of a predetermined polar code. Each of the first sections may be a unit object of the first polar encoding operation. The first encoder 171 may perform the first polar encoding operation to the respective first sections in the original message, and thus the first polar encoding operation may be repeated as many times as a number of the first sections included in the original message.

FIG. 88B exemplifies the original message including four (4) first sections S11, S12, S13 and S14 each having four (4) symbols. In detail, FIG. 8B exemplifies the first-first section S11 having symbols A1, A2, A3 and A4, the second-first section S12 having symbols B1, B2, B3 and B4, the third-first section S13 having symbols C1, C2, C3 and C4, and the fourth-first section S14 having symbols D1, D2, D3 and D4. Therefore, FIG. 8B exemplifies the original message having 16 symbols.

Referring to FIGS. 8A and 8B, the first encoder 171 may generate first polar parities P11, P12, P13 and P14 respectively corresponding to the first sections S11, S12, S13 and S14 of the original message by performing the first polar encoding operation to the respective first sections S11, S12, S13 and S14 of the original message. In detail, the first encoder 171 may generate the first-first polar parity P11 corresponding to the first-first section S11 by performing the first polar encoding operation to the first-first section S11, may generate the second-first polar parity P12 corresponding to the second-first section S12 by performing the first polar encoding operation to the second-first section S12, may generate the third-first polar parity P13 corresponding to the third-first section S13 by performing the first polar encoding operation to the third-first section S13, and may generate the fourth-first polar parity P14 corresponding to the fourth-first section S14 by performing the first polar encoding operation to the fourth-first section S14.

Reliabilities of the respective symbols included in the respective first sections S11, S12, S13 and S14 of the original message to be encoded by the first encoder 171 may be different depending on locations thereof in the respective first sections S11, S12, S13 and S14. In general, the reliabilities of the symbols located front side of the respective first sections S11, S12, S13 and S14 are relatively high while the reliabilities of the symbols located rear side of the respective first sections S11, S12, S13 and S14 are relatively low. The reliability of each symbol may correspond to a channel capacity of each symbol.

When performing a decoding operation to the symbols of the polar-encoded messages by the belief propagation scheme, the reliability of each symbol may be calculated by following equations 1 and 2. In detail, the reliabilities of $(2^i)^{th}$ symbols of the respective first sections S11, S12, S13 and S14 of the original message may be calculated by equation 1, and the reliabilities of $(2^i+1)^{th}$ to $(2^{i+1}-1)^{th}$ symbols of the respective first sections S11, S12, S13 and S14 may be calculated by equation 2.

$$d(2^i)=2^i \qquad \text{[Equation 1]}$$

In equation 1, "$2^i$" may represent a sequence of the respective symbols of the respective first sections S11, S12, S13 and S14 of the original message, and "i" may be an integer between one (1) and "n". "$2^n$" may represent a number of symbols included in the respective first sections S11, S12, S13 and S14.

Referring to FIG. 8B, a number of symbols included in the respective first sections S11, S12, S13 and S14 may be four ($4=2^n$ where n=2). Accordingly, each reliability of the first symbols A1, B1, C1 and D1 (i.e., $2^0=1$) of the respective first sections S11, S12, S13 and S14 may be one (1=d(2⁰)), each reliability of the second symbols A2, B2, C2 and D2 (i.e., $2^1$=2) of the respective first sections S11, S12, S13 and S14 may be two (2=d($2^1$)), and each reliability of the fourth symbols A4, B4, C4 and D4 (i.e., $2^2$=4) of the respective first sections S11, S12, S13 and S14 may be four (4=d($2^2$)).

$$d(2^i+m)=2\times d(m) \quad \text{[Equation 2]}$$

In equation 2, "$2^i$+m" may represent a sequence of the respective symbols of the respective first sections S11, S12, S13 and S14 of the original message, and "m" may be an integer between one (1) and "$2^i$-1". For example, "m" may be one (1) when "i" is one (1), and "m" may be an integer between one (1) and three (3) when "i" is two (2).

Referring to FIG. 8B and equation 2, each reliability of the third symbols A3, B3, C3 and D3 (i.e., $2^1$+1=3) of the respective first sections S11, S12, S13 and S14 of the original message may be two (2=2×d(2⁰)).

The interleaver 173 may generate an interleaved message $U_2$ by interleaving based on the predetermined polar code of the original message according to first reliabilities, which are predetermined depending on the locations of the respective symbols in the respective first sections S11, S12, S13 and S14 in the original message, and second reliabilities, which are predetermined depending on locations of the respective symbols in the interleaved message $U_2$. In detail, the interleaver 173 may generate the interleaved message $U_2$ by interleaving the original message such that the symbols located to have relatively low first reliabilities in the respective first sections S11, S12, S13 and S14 in the original message that is, before the interleaving, are located to have relatively high second reliabilities in the interleaved message $U_2$ that is, after the interleaving.

The interleaved message $U_2$ may have sections, a number of which are the same as or different from those in the original message. For example, when the original message has four sections, the interleaved message $U_2$ may have the same or different numbers for example, 3, 4 or 5 numbers of sections as or from those in the original message. For example, when the original message has four sections and each section has four symbols, the interleaved message $U_2$ may have four sections each having four symbols, or may have two sections each having eight symbols.

FIG. 8B exemplifies the interleaved message $U_2$ having second sections S21, S22, S23 and S24, a number of which is the same as the first sections S11, S12, S13 and S14 of the original message, and each of the second sections S21, S22, S23 and S24 having four symbols. Each of the second sections S21, S22, S23 and S24 may be a unit object of the second polar encoding operation performed by the second encoder 175.

As to the interleaving of the original message according to the first reliability and the second reliability, the interleaver 173 may generate the interleaved message $U_2$ by interleaving the original message such that the symbols having the first reliability lower than a predetermined reliability in the original message are interleaved to have the second reliability higher than the predetermined reliability in the interleaved message $U_2$. The predetermined reliability may be a representative value for example, an intermediate value, an average value or a most frequent value of the first and second reliabilities of the symbols. For example, when the predetermined reliability is two (2), the interleaver 173 may generate the interleaved message $U_2$ by interleaving the original message such that the symbols A1, B1, C1 and D1 having the first reliability of one (1) lower than the predetermined reliability of two (2) in the original message are interleaved to have the second reliability higher than the predetermined reliability of two (2) in the interleaved message $U_2$.

Further as to the interleaving of the original message according to the first reliability and the second reliability, the interleaver 173 may generate the interleaved message $U_2$ by interleaving the original message such that the symbols A1, B1, C1 and D1 having the first reliability of the lowest value in the original message are interleaved to have the second reliability of the highest value in the interleaved message $U_2$.

Further as to the interleaving of the original message according to the first reliability and the second reliability, the interleaver 173 may generate the interleaved message $U_2$ by interleaving the original message such that the order of the second reliabilities in the interleaved message $U_2$ is reversed from the order of the first reliabilities in the original message. For example, referring to FIG. 8B, the interleaver 173 may generate the interleaved message $U_2$ by interleaving the original message such that the order of the second reliabilities in the interleaved message $U_2$ is reversed from the order of the first reliabilities in the original message. The reversed order may be made by interleaving the first symbols A1, B1, C1 and D1 of the respective first sections S11, S12, S13 and S14 of the original message to be located in a fourth location in the respective second sections S21, S22, S23 and S24 of the interleaved message $U_2$, by interleaving the second symbols A2, B2, C2 and D2 of the respective first sections S11, S12, S13 and S14 of the original message to be located in a third location in the respective second sections S21, S22, S23 and S24 of the interleaved message $U_2$, by interleaving the third symbols A3, B3, C3 and D3 of the respective first sections S11, S12, S13 and S14 of the original message to be located in a second location in the respective second sections S21, S22, S23 and S24 of the interleaved message $U_2$, and by interleaving the fourth symbols A4, B4, C4 and D4 of the respective first sections S11, S12, S13 and S14 of the original message to be located in a first location in the respective second sections S21, S22, S23 and S24 of the interleaved message $U_2$. Accordingly, as exemplified in FIG. 8B, the first-second section S21 of the interleaved message $U_2$ may include the symbols A4, D3, C2 and B1, the second-second section S22 of the interleaved message $U_2$ may include the symbols B4, A3, D2 and C1, the third-second section S23 of the interleaved message $U_2$ may include the symbols C4, B3, A2 and D1, and the fourth-second section S24 of the interleaved message $U_2$ may include the symbols D4, C3, B2 and A1.

Referring to FIG. 8B and equations 1 and 2, in the respective second sections S21, S22, S23 and S24 of the interleaved message $U_2$, each reliability of the first symbols A4, B4, C4 and D4 may be one (1), each reliability of the second symbols A3, B3, C3 and D3 may be two (2), each reliability of the third symbols A2, B2, C2 and D2 may be two (2), and each reliability of the fourth symbols A1, B1, C1 and D1 may be four (4). Accordingly, the second reliabilities of the respective symbols in the interleaved message $U_2$ may be reversed from the first reliabilities of the respective symbols in the original message.

Further, the interleaver 173 may interleave the original message such that the symbols included in the first sections S11, S12, S13 and S14 of the original message are interleaved to be evenly distributed in the second sections S21, S22, S23 and S24 of the interleaved message $U_2$. For example, referring to FIG. 8B, the interleaver 173 may generate the interleaved message $U_2$ by interleaving the original message such that, in the interleaved message $U_2$, the first-second section S21 includes the symbols A4, D3, C2 and B1 of the respective first sections S11, S12, S13 and S14, the second-second section S22 includes the symbols B4, A3, D2 and C1 of the respective first sections S11, S12, S13 and S14, the third-second section S23 includes the symbols C4, B3, A2 and D1 of the respective first sections S11, S12, S13 and S14, and the fourth-second section S24 includes the symbols D4, C3, B2 and A1 of the respective first sections S11, S12, S13 and S14.

The second encoder 175 may generate a second polar parity P2 for plural sections of the interleaved message $U_2$ provided from the interleaver 173 by performing a second polar encoding operation to the respective second sections S21, S22, S23 and S24 of the interleaved message $U_2$, and thus may generate a second encoded message $U_3$. The second encoded message $U_3$ may include the interleaved message $U_2$ and a second polar parity message, and the second polar parity message may include the second polar parities for the respective second sections S21, S22, S23 and S24 of the interleaved message $U_2$.

In detail, the second encoder 175 may perform the second polar encoding operation to the interleaved message $U_2$ by performing the second polar encoding operation to the respective second sections S21, S22, S23 and S24 of the interleaved message $U_2$, and thus the second polar encoding operation may be repeated as many as a number of the second sections S21, S22, S23 and S24 included in interleaved message $U_2$.

Referring to FIGS. 8A and 8B, the second encoder 175 may generate the second polar parities P21, P22, P23 and P24 respectively corresponding to the second sections S21, S22, S23 and S24 by performing the second polar encoding operation to the respective second sections S21, S22, S23 and S24. In detail, the second encoder 175 may generate the first-second polar parity P21 corresponding to the first-second section S21 by performing the second polar encoding operation to the first-second section S21, may generate the second-second polar parity P22 corresponding to the second-second section S22 by performing the second polar encoding operation to the second-second section S22, may generate the third-second polar parity P23 corresponding to the third-second section S23 by performing the second polar encoding operation to the third-second section S23, and may generate the fourth-second polar parity P24 corresponding to the fourth-second section S24 by performing the second polar encoding operation to the fourth-second section S24.

Further, the second encoder 175 may perform an additional second polar encoding operation to the first polar parity message P1 in order for the second polar parity message P2 to secure the first polar parity message P1, when the first polar parity message P1 is provided to the second encoder 175 from the first encoder 171 through the interleaver 173. The first polar parity message P1 may include the first polar parities P11, P12, P13 and P14, and the second polar parity message P2 may include the second polar parities P21, P22, P23 and P24.

The summing unit 177 may generate the third encoded message X by summing the first encoded message $U_1$ provided from the first encoder 171 and the second encoded message $U_3$ provided from the second encoder 175. In detail, the summing unit 177 may generate the third encoded message X by summing the first encoded message $U_1$ provided from the first encoder 171 and the second polar parity message P2 of the second encoded message $U_3$ provided from the second encoder 175. The generated third encoded message X may be stored into the memory cell array 210 of the semiconductor memory device 200 through the memory interface 150.

Hereinafter, described with reference to FIG. 8A will be the ECC decoder 180.

Referring to FIG. 8A, the ECC decoder 180 may include a first decoder 181, an interleaver 183 and a second decoder 185.

The first decoder 181 may perform a first polar decoding operation to a codeword Y, which corresponds to the third encoded message X, read from the memory cell array 210 of the semiconductor memory device 200 and a de-interleaved message $U_8$ provided from the interleaver 183, and may output a first decoded message $u_4$ when the first polar decoding operation to the codeword Y or the de-interleaved message $U_8$ is successful.

In detail, the first decoder 181 may perform the first polar decoding operation to the codeword Y and the de-interleaved message $U_8$ by using parts, which correspond to the respective first sections S11, S12, S13 and S14 of the original message and the respective first polar parities P11, P12, P13 and P14 of the first polar parity message P1, included in the codeword Y or the de-interleaved message $U_8$. The codeword Y may include messages respectively corresponding to the original message, the first polar parity message P1 and the second polar parity message P2 of the third encoded message X. The first decoded message $u_4$ may correspond to the original message. The first polar decoding operation may be a reversed process of the first polar encoding operation.

When the first decoder 181 fails the first polar decoding operation, the interleaver 183 may generate an interleaved message $U_5$ by interleaving an updated message $U_9$, which is updated during the first polar decoding operation of the first decoder 181, and may provide the interleaved message $U_5$ to the second decoder 185.

In detail, the interleaver 183 may interleave a part corresponding to the original message in the updated message $U_9$ in the same manner as the interleaver 173 of the ECC encoder 170. A message part of the interleaved message $U_5$ may correspond to the interleaved message $U_2$. The updated message $U_9$ may be the codeword Y or the updated de-interleaved message $U_8$, which is updated by the first polar decoding operation of the first decoder 181 to the codeword Y or the de-interleaved message $U_8$.

The second decoder 185 may perform a second polar decoding operation to the interleaved message $U_5$ provided from the interleaver 183, and may output a second decoded message $u_6$ when the second polar decoding operation is successful.

In detail, the second decoder 185 may perform the second polar decoding operation to the interleaved message $U_5$ by using parts, which correspond to the interleaved message $U_2$ and the second polar parity message P2, included in the interleaved message $U_5$. That is, the second decoder 185 may perform the second polar decoding operation to the interleaved message $U_5$ by using parts, which correspond to the respective second sections S21, S22, S23 and S24 of the interleaved message $U_2$ and the respective second polar parities P21, P22, P23 and P24 of the second polar parity message P2, included in the interleaved message $U_5$. The second polar decoding operation may be a reversed process of the second polar encoding operation. The second decoded message $U_6$ may correspond to the original message.

When the second decoder 185 fails the second polar decoding operation, the interleaver 183 may generate an interleaved message $U_8$ by de-interleaving an updated message $U_7$, which is updated during the second polar decoding operation of the second decoder 185, and may provide the interleaved message $U_8$ to the first decoder 181.

In detail, the interleaver 183 may interleave a part corresponding to the original message in the updated message $U_7$ in the same manner as the interleaver 173 of the ECC encoder 170. The updated message $U_7$ may be the interleaved message $U_5$, which is updated by the second polar decoding operation of the second decoder 185 to the interleaved message $U_5$.

As described above, the ECC decoder 180 may generate a decoded message through the first decoder 181 and the second decoder 185 alternately performing the first and second polar decoding operations to the codeword Y.

Figure 9:
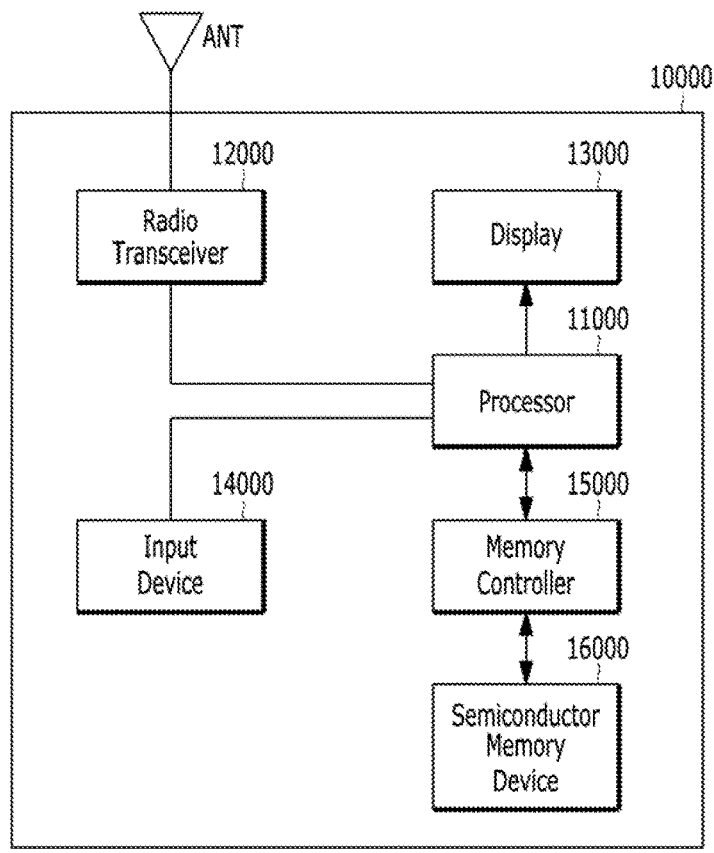
FIG. 9 is a block diagram schematically illustrating an electronic apparatus including a semiconductor memory system in accordance with an embodiment of the present invention.

FIG. 9 is a block diagram schematically illustrating an electronic apparatus 10000 including a memory controller 15000 and a semiconductor memory device 16000 in accordance with an embodiment of the present invention.

Referring to FIG. 9, the electronic apparatus 10000 may be any suitable electronic apparatus such as a cellular phone, a smart phone, or a tablet PC including the semiconductor memory device 16000 and the memory controller 15000. The semiconductor memory device 16000 may be implemented by any suitable memory device, including, for example, a flash memory device, such as NAND or a NOR flash. The memory controller 15000 may control the semiconductor memory device 16000.

The semiconductor memory device 16000 may correspond to the semiconductor memory device 200 described above with reference to FIGS. 3 to 4B. The semiconductor memory device 16000 may store random data.

The memory controller 15000 may correspond to the memory controller 100 described with reference to FIGS. 3 to 8E. The memory controller 15000 may be controlled by a processor 11000 which may control overall operations of the electronic apparatus 10000.

Data stored in the semiconductor memory device 16000 may be displayed through a display 13000 under the control of the memory controller 15000. The memory controller 15000 may operate under the control of the processor 11000.

A radio transceiver 12000 may receive and output a radio signal through an antenna ANT. For example, the radio transceiver 12000 may convert the received radio signal from the antenna ANT into a signal to be processed by the processor 11000. Thus, the processor 11000 may process the converted signal from the radio transceiver 12000, and may store the processed signal at the semiconductor memory device 16000. Otherwise, the processor 11000 may display the processed signal through the display 13000.

The radio transceiver 12000 may convert a signal from the processor 11000 into a radio signal, and may output the converted radio signal to an external device through the antenna ANT.

An input device 14000 may receive a control signal for controlling operations of the processor 11000 or data to be processed by the processor 11000. The input device 14000 may be implemented, for example, by a pointing device such as a touch pad, a computer mouse, a key pad, or a keyboard.

The processor 11000 may control the display 13000 so that the data from the semiconductor memory device 16000, the radio signal from the radio transceiver 12000 or the data from the input device 14000 is displayed through the display 13000.

Figure 10:
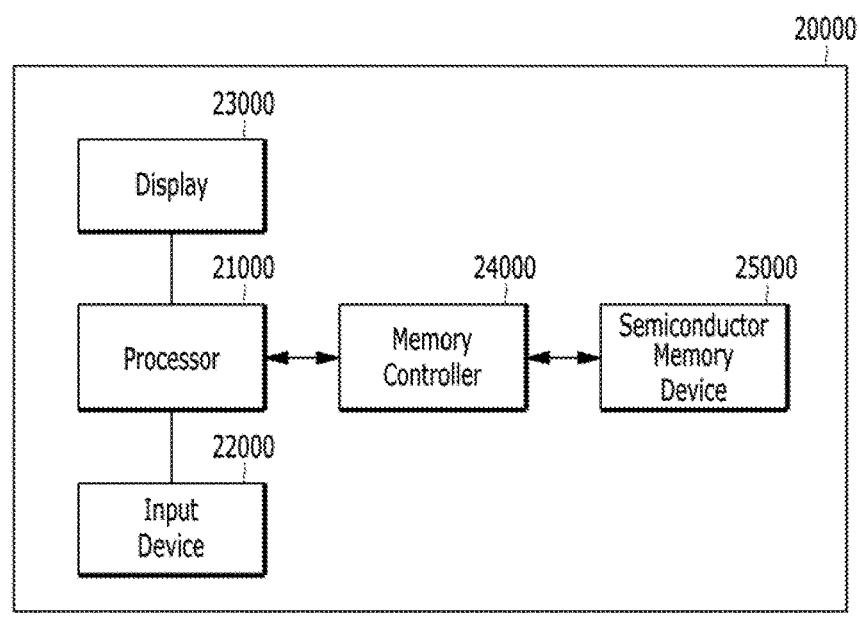
FIG. 10 is a block diagram schematically illustrating an electronic apparatus including a semiconductor memory system in accordance with another embodiment of the present invention.

FIG. 10 is a block diagram schematically illustrating an electronic apparatus 20000 including a memory controller 24000 and a semiconductor memory device 25000 in accordance with another embodiment of the present invention.

The memory controller 24000 and the semiconductor memory device 25000 may correspond to the memory controller 100 and the semiconductor memory device 200 described with reference to FIGS. 3 to 8E, respectively.

Referring to FIG. 10, the electronic apparatus 20000 may be implemented by a data processing device such as a personal computer (PC), a tablet computer, a net-book, an e-reader, a personal digital assistant (PDA), a portable multimedia player (PMP), an MP3 player, or an MP4 player, and may include the semiconductor memory device 25000, for example, a flash memory device, and the memory controller 24000 to control the operations of the semiconductor memory device 25000.

The electronic apparatus 20000 may include a processor 21000 to control overall operations of the electronic apparatus 20000. The memory controller 24000 may be controlled by the processor 21000.

The processor 21000 may display data stored in the semiconductor memory device 25000 through a display 23000 according to an input signal from an input device 22000. For example, the input device 22000 may be implemented, for example, by a pointing device such as a touch pad, a computer mouse, a key pad, or a keyboard.

Figure 11:
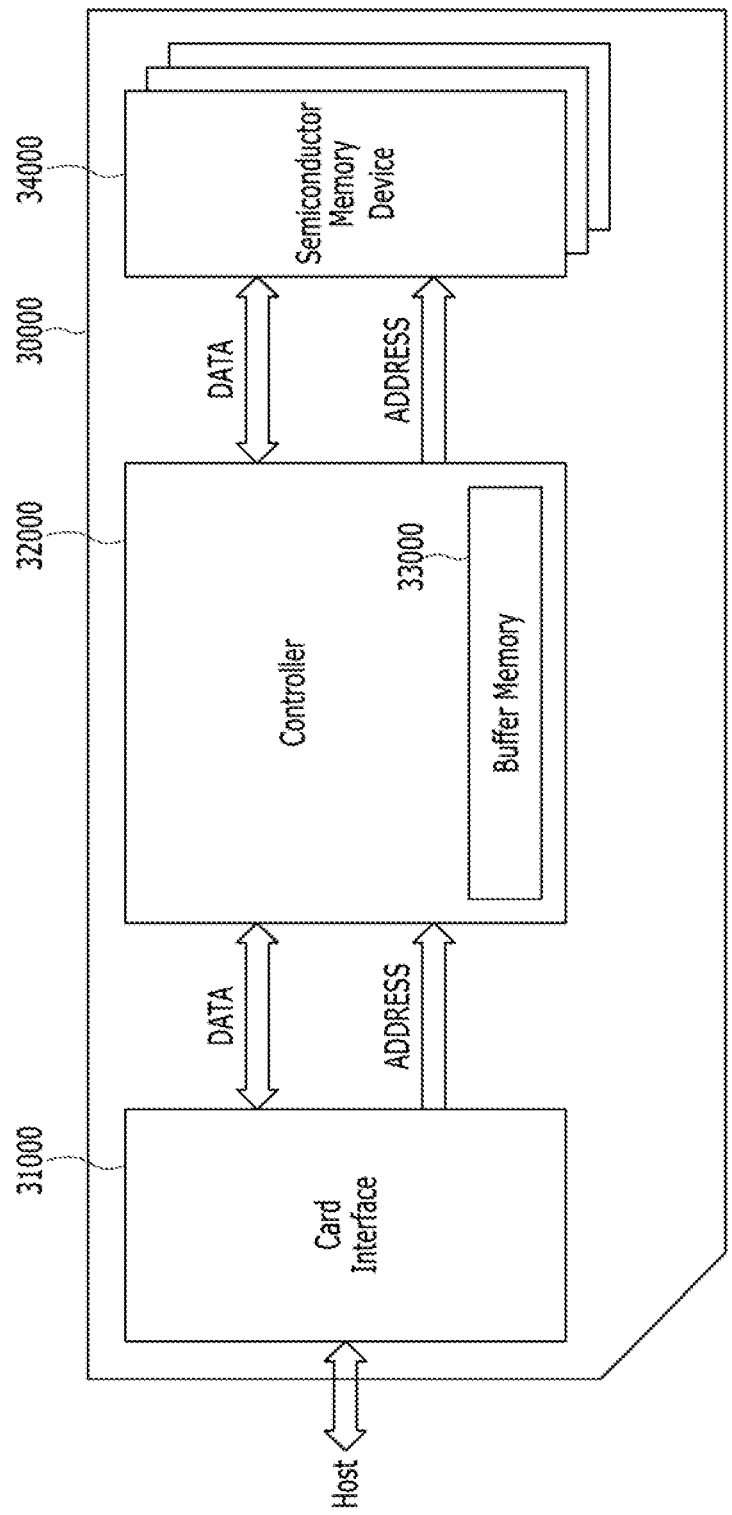
FIG. 11 is a block diagram schematically illustrating an electronic apparatus including a semiconductor memory system in accordance with yet another embodiment of the present invention.

FIG. 11 is a block diagram schematically illustrating an electronic apparatus 30000 including a controller 32000 and a semiconductor memory device 34000, in accordance with yet another embodiment of the present invention.

The controller 32000 and the semiconductor memory device 34000 may correspond to the memory controller 100 and the semiconductor memory device 200 described with reference to FIGS. 3 to 8E, respectively.

Referring to FIG. 11, the electronic apparatus 30000 may include a card interface 31000, the controller 32000, and the semiconductor memory device 34000 which may be implemented, for example, with a flash memory device.

The electronic apparatus 30000 may exchange data with a host through the card interface 31000. The card interface 31000 may be a secure digital (SD) card interface or a multi-media card (MMC) interface, which will not limit the scope of the present invention. The card interface 31000 may interface the host and the controller 32000 according to a communication protocol of the host capable of communicating with the electronic apparatus 30000.

The controller 32000 may control overall operations of the electronic apparatus 30000, and may control data exchange between the card interface 31000 and the semiconductor memory device 34000. A buffer memory 33000 of the controller 32000 may buffer data transferred between the card interface 31000 and the semiconductor memory device 34000.

The controller 32000 may be coupled with the card interface 31000 and the semiconductor memory device 34000 through a data bus DATA and an address bus ADDRESS. In accordance with an embodiment, the controller 32000 may receive an address of data, which is to be read or written, from the card interface 31000, through the address bus ADDRESS, and may send it to the semiconductor memory device 34000. Further, the controller 32000 may receive or transfer data to be read or written through the data bus DATA connected with the card interface 31000 or the semiconductor memory device 34000.

When the electronic apparatus 30000 is connected with the host such as a PC, a tablet PC, a digital camera, a digital audio player, a mobile phone, console video game hardware or a digital set-top box, the host may exchange data with the semiconductor memory device 34000 through the card interface 31000 and the controller 32000.

Figure 12:
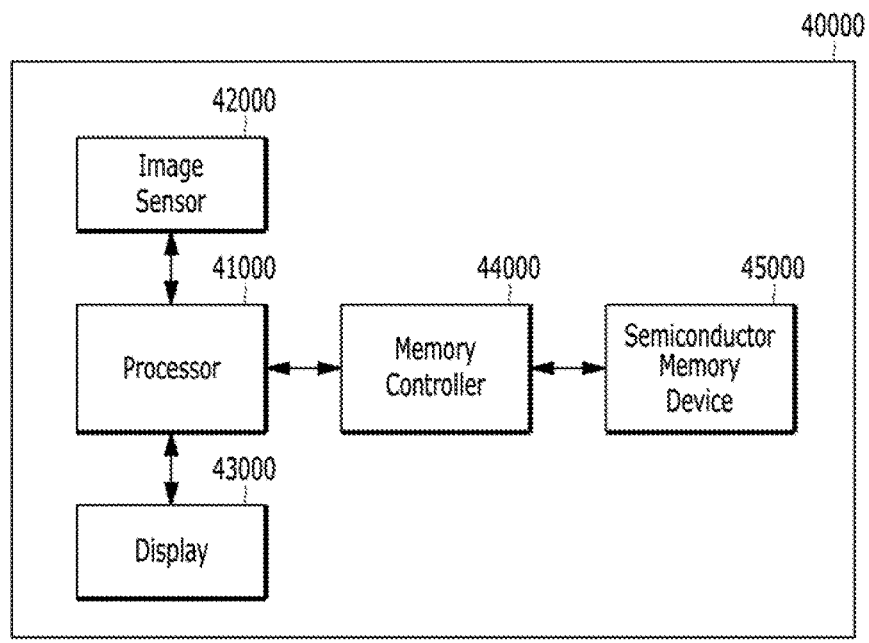
FIG. 12 is a block diagram schematically illustrating an electronic apparatus including a semiconductor memory system in accordance with yet another embodiment of the present invention.

FIG. 12 is a block diagram schematically illustrating an electronic apparatus 40000 including a memory controller 44000 and a semiconductor memory device 45000 in accordance with yet another embodiment of the present invention.

The memory controller 44000 and the semiconductor memory device 45000 may correspond to the memory controller 100 and the semiconductor memory device 200 described with reference to FIGS. 3 to 8E, respectively.

Referring to FIG. 12, the electronic apparatus 40000 may include the semiconductor memory device 45000, for example, a flash memory device, the memory controller 44000 to control a data processing operation of the semiconductor memory device 45000, and a processor 41000 to control overall operations of the electronic apparatus 40000.

Further, an image sensor 42000 of the electronic apparatus 40000 may convert an optical signal into a digital signal, and the converted digital signal may be stored in the semiconductor memory device 45000 under the control of the processor 41000. Otherwise, the converted digital signal may be displayed through a display 43000 under the control of the processor 41000.

Figure 13:
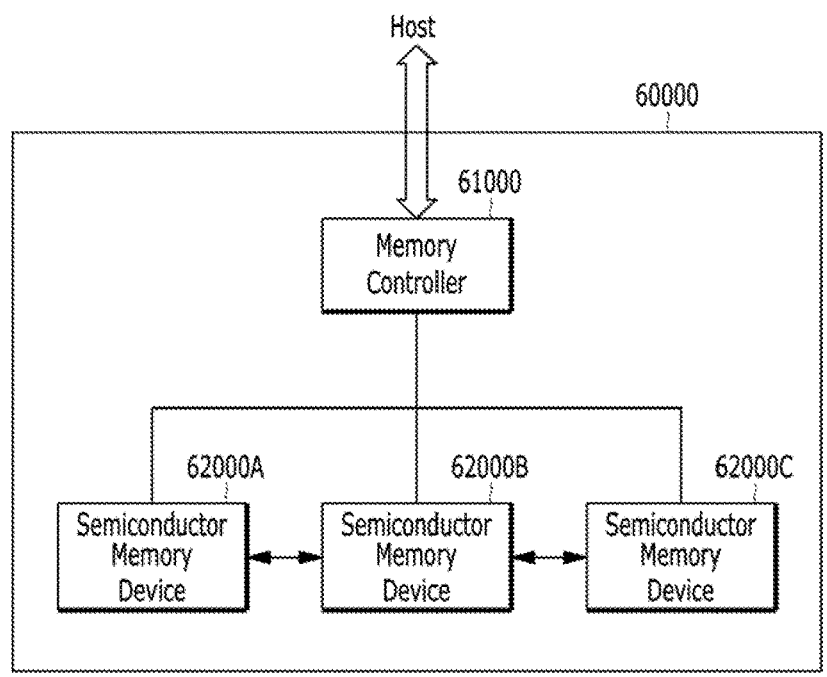
FIG. 13 is a block diagram schematically illustrating an electronic apparatus including a semiconductor memory system in accordance with yet another embodiment of the present invention.

FIG. 13 is a block diagram schematically illustrating an electronic apparatus 60000 including a memory controller 61000 and semiconductor memory devices 62000A, 62000B, and 62000C, in accordance with yet another embodiment of the present invention.

The memory controller 61000 and each of the semiconductor memory devices 62000A, 62000B, and 62000C may correspond to the memory controller 100 and the semiconductor memory device 200 described with reference to FIGS. 3 to 8E, respectively.

Referring to FIG. 13, the electronic apparatus 60000 may be implemented by a data storage device such as a solid state drive (SSD).

The electronic apparatus 60000 may include the plurality of semiconductor memory devices 62000A, 62000B, and 62000C and the memory controller 61000 to control a data processing operation of each of the semiconductor memory devices 62000A, 62000B, and 62000C.

The electronic apparatus 60000 may be implemented by a memory system or a memory module.

For example, the memory controller 61000 may be implemented outside or inside the electronic apparatus 60000.

Figure 14:
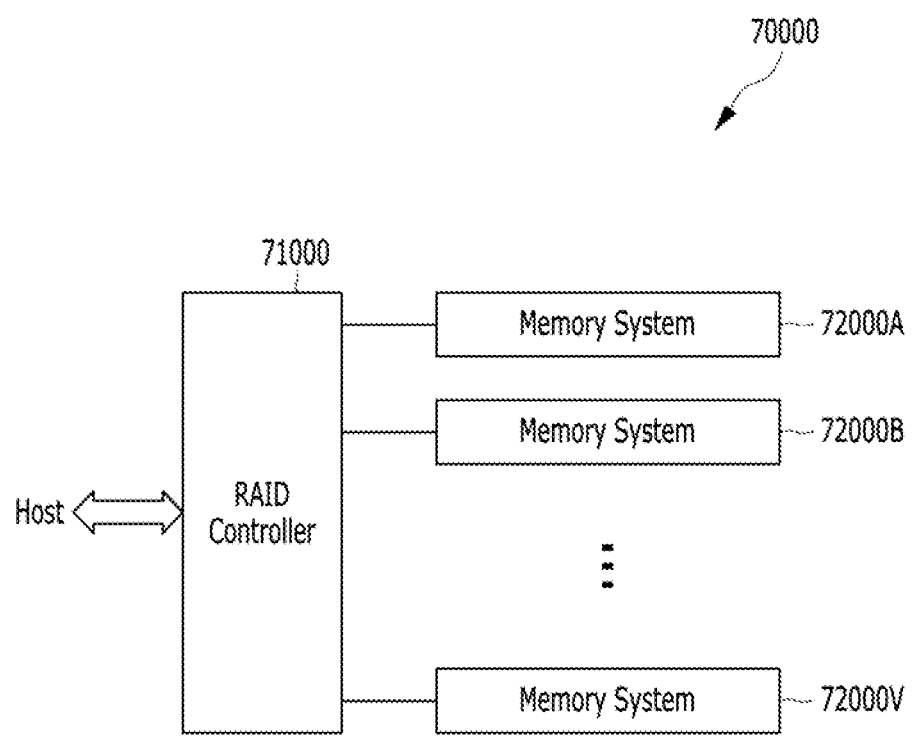
FIG. 14 is a block diagram of a data processing system including the electronic apparatus shown in FIG. 13.

FIG. 14 is a block diagram of a data processing system including the electronic apparatus 6000 described with reference to FIG. 13.

Referring to FIGS. 13 and 14, a data storage device 70000 may be implemented by a redundant array of independent disks (RAID) system. The data storage device 70000 may include a RAID controller 71000 and a plurality of memory systems 72000A to 72000N, where N is a natural number.

Each of the memory systems 72000A to 72000N may correspond to the electronic apparatus 60000 described with reference to FIG. 13. The memory systems 72000A to 72000N may form a RAID array. The data storage device 70000 may be implemented by an SSD.

During a program operation, the RAID controller 71000 may output program data, which is output from a host, to one of the memory systems 72000A to 72000N selected according to one of a plurality of RAID levels based on RAID level information output from the host.

During a read operation, the RAID controller 71000 may transfer data, which is read from one of the memory systems 72000A to 72000N, to the host according to one of the RAID levels based on the RAID level information output from the host.

While the present invention has been described with respect to specific embodiments, it will be apparent to those skilled in the art that various changes and modifications may be made without departing from the spirit and scope of the invention as defined in the following claims.

What is claimed is:

1. A controller comprising:
   a first encoder suitable for generating a first polar parity by performing a first polar encoding operation to respective first sections of an original message having a plurality of symbols;
   an interleaver suitable for generating an interleaved message by interleaving the original message according to first reliabilities, which are predetermined depending on locations of the respective symbols in the respective first sections in the original message, and second reliabilities, which are predetermined depending on locations of the respective symbols in the interleaved message;
   a second encoder suitable for generating a second polar parity by performing a second polar encoding operation to respective second sections included in the interleaved message; and
   a memory interface suitable for storing the original message, the first polar parity and the second polar parity into a memory device.

2. The controller of claim 1, wherein the interleaver interleaves the original message such that one of the first and second reliabilities of the respective symbols is equal to or higher than a predetermined reliability.

3. The controller of claim 1, wherein the interleaver interleaves the original message such that, among the plurality of symbols, a symbol having the first reliability of relatively lower value than the other symbols in the original message are interleaved to have the second reliability of relatively higher value than the other symbols in the interleaved message.

4. The controller of claim 1, wherein the interleaver interleaves the original message such that an order of the second reliabilities of the symbols in the interleaved message is reversed from an order of the first reliabilities of the symbols in the original message.

5. The controller of claim 1, wherein a number of the first sections is different from a number of the second sections.

6. The controller of claim 1, wherein a number of the first sections is the same as a number of the second sections.

7. The controller of claim 1, wherein the second encoder further generates an additional second polar parity by performing the second polar encoding operation to the first polar parity.

8. An operation method for a controller, the method comprising:
   performing a first polar decoding operation to respective first sections included in an original message by using a first polar parity, wherein the original message and the first polar parity are included in a codeword;
   interleaving, when the first polar decoding operation fails, the original message, to which the first polar decoding operation is performed, according to first reliabilities, which are predetermined depending on locations of the respective symbols in the respective first sections in the original message, and second reliabilities, which are predetermined depending on locations of the respective symbols in the interleaved message;
   performing a second polar decoding operation to respective second sections included in the interleaved original message by using a second polar parity;
   de-interleaving, when the second polar decoding operation fails, the original message, to which the second polar decoding operation is performed; and performing the first polar decoding operation to the respective first sections of the de-interleaved original message by using the first polar parity.

9. The method of claim 8, wherein the interleaving of the original message is performed such that one of the first and second reliabilities of the respective symbols is equal to or higher than a predetermined reliability.

10. The method of claim 8, wherein the interleaving of the original message is performed such that, among the plurality of symbols, a symbol having the first reliability of relatively lower value than the other symbols in the original message are interleaved to have the second reliability of relatively higher value than the other symbols in the interleaved message.

11. The method of claim 8, wherein the interleaving of the original message is performed such that an order of the second reliabilities of the symbols in the original message is reversed from an order of the first reliabilities of the symbols in the interleaved message.

12. The method of claim 8, wherein a number of the first sections is different from a number of the second sections.

13. The method of claim 8, wherein a number of the first sections is the same as a number of the second sections.

14. A controller, comprising:
- a first decoder suitable for performing a first polar decoding operation to respective first sections included in an original message by using a first polar parity, wherein the original message and the first polar parity are included in a codeword;
- an interleaver suitable for interleaving, when the first polar decoding operation fails, the original message, to which the first polar decoding operation is performed, according to first reliabilities, which are predetermined depending on locations of the respective symbols in the respective first sections in the original message, and second reliabilities, which are predetermined depending on locations of the respective symbols in the interleaved message; and
- a second decoder suitable for performing a second polar decoding operation to respective second sections included in the interleaved original message by using a second polar parity,
- wherein the interleaver further de-interleaves, when the second polar decoding operation fails, the original message, to which the second polar decoding operation is performed, and
- wherein the first decoder further performs the first polar decoding operation to the respective first sections of the de-interleaved original message by using the first polar parity.

15. The controller of claim 14, wherein the interleaver interleaves the original message such that one of the first and second reliabilities of the respective symbols is equal to or higher than a predetermined reliability.

16. The controller of claim 14, wherein the interleaver interleaves the original message such that, among the plurality of symbols, a symbol having the first reliability of relatively lower value than the other symbols in the original message are interleaved to have the second reliability of relatively higher value than the other symbols in the interleaved message.

17. The controller of claim 14, wherein the interleaver interleaves the original message such that an order of the second reliabilities of the symbols in the original message is reversed from an order of the first reliabilities of the symbols in the interleaved message.

18. The controller of claim 14, wherein a number of the first sections is different from a number of the second sections.

19. The controller of claim 14, wherein a number of the first sections is the same as a number of the second sections.

* * * * *